(12) United States Patent
Lee et al.

(10) Patent No.: US 8,796,667 B2
(45) Date of Patent: Aug. 5, 2014

(54) STATIC RANDOM ACCESS MEMORIES HAVING CARBON NANOTUBE THIN FILMS

(75) Inventors: Eun-hong Lee, Anyang-si (KR); Un-jeong Kim, Busan (KR); Woo-jong Yu, Suwon-si (KR); Young-hee Lee, Suwon-si (KR)

(73) Assignees: Samsung Electronics Co., Ltd., Gyeonggi-Do (KR); Sungkyunkwan University Foundation for Corporate Collaboration, Gyeonggi-Do (KR)

( * ) Notice: Subject to any disclaimer, the term of this patent is extended or adjusted under 35 U.S.C. 154(b) by 208 days.

(21) Appl. No.: 12/591,773

(22) Filed: Dec. 1, 2009

(65) Prior Publication Data
US 2010/0207102 A1    Aug. 19, 2010

(30) Foreign Application Priority Data
Feb. 18, 2009  (KR) ........................ 10-2009-0013504

(51) Int. Cl.
*H01L 29/06*   (2006.01)

(52) U.S. Cl.
USPC ...... 257/24; 257/209; 257/213; 257/E23.074; 438/285; 438/299; 438/151; 438/499

(58) Field of Classification Search
USPC .................. 257/209, 213, 288, 316, E23.074, 257/E51.04; 438/285, 299, 151, 155, 499
See application file for complete search history.

(56) References Cited

U.S. PATENT DOCUMENTS

| | | | |
|---|---|---|---|
| 5,793,671 A | 8/1998 | Selcuk | |
| 7,115,960 B2 | 10/2006 | Bertin et al. | |
| 7,245,520 B2 | 7/2007 | Bertin et al. | |
| 7,288,970 B2 | 10/2007 | Bertin | |
| 7,492,015 B2 | 2/2009 | Chen et al. | |
| 7,535,016 B2 | 5/2009 | Furukawa et al. | |
| 7,622,732 B1 | 11/2009 | Tombler, Jr. | |
| 2005/0270824 A1 | 12/2005 | Bertin et al. | |
| 2006/0063318 A1 | 3/2006 | Datta et al. | |
| 2006/0183278 A1 | 8/2006 | Bertin et al. | |
| 2006/0237857 A1 | 10/2006 | Bertin et al. | |
| 2007/0102747 A1* | 5/2007 | Chen et al. | 257/314 |
| 2007/0280009 A1* | 12/2007 | Otsuka et al. | 365/189.09 |

(Continued)

FOREIGN PATENT DOCUMENTS

| | | |
|---|---|---|
| JP | S60-050695 A | 3/1985 |
| JP | 2008-010566 A | 1/2008 |

(Continued)

OTHER PUBLICATIONS

European Search Report for corresponding foreign application, mailed Jun. 14, 2010.

(Continued)

*Primary Examiner* — Mark A Laurenzi
(74) *Attorney, Agent, or Firm* — Harness, Dickey & Pierce, P.L.C.

(57) ABSTRACT

A static random access memory (SRAM) includes: a first carbon nanotube (CNT) inverter, a second CNT inverter, a first switching transistor, and a second switching transistor. The first CNT inverter includes at least a first CNT transistor. The second CNT inverter is connected to the first CNT inverter and includes at least one second CNT transistor. The first switching transistor is connected to the first CNT inverter. The second switching transistor is connected to the second CNT inverter.

17 Claims, 4 Drawing Sheets

(56) References Cited

U.S. PATENT DOCUMENTS

| | | | |
|---|---|---|---|
| 2008/0143389 A1 | 6/2008 | Keshavarzi et al. | |
| 2009/0065769 A1 | 3/2009 | Yukawa et al. | |
| 2009/0267647 A1* | 10/2009 | Kim et al. | 326/50 |
| 2010/0163858 A1* | 7/2010 | Toguchi et al. | 257/40 |

FOREIGN PATENT DOCUMENTS

| | | |
|---|---|---|
| JP | 2008-205168 A | 9/2008 |
| KR | 10-2006-0123859 | 12/2006 |
| KR | 10-2008-0003889 | 1/2008 |
| WO | WO 2006/033682 | 3/2006 |

OTHER PUBLICATIONS

Sheng Lin et al. "A new SRAM cell design using CNTFETs." SOC Design Conference, IEEE, Piscataway, NJ, USA, Nov. 24, 2008, pp. 168-171.

Young Bok Kim et al. "A low power 8T SRAM cell design technique for CNFET." SOC Design Conference, IEEE, Piscataway, NJ, USA, Nov. 24, 2008, pp. 176-179.

Michael Engel et al. Top-gated Thin Film FETs Fabricated from Arrays of Self-aligned Semiconducting Carbon Nanotubes. Device Research Conference, 2008, IEEE, Piscataway, NJ, USA, Jun. 23, 2008, pp. 149-150.

S.J. Wind et al. "Vertical scaling of carbon nanotube field-effect transistors using top gate electrodes." Applied Physics Letters, AIP, American Institute of Physics, Melville, NY, USA, vol. 80, No. 20, May 20, 2002, pp. 3817-3819.

Zhiyong Zhang et al. "Doping-free fabrication of carbon nanotube based ballistic CMOS devices and circuits." Nano Letters American Chemical Society USA, vol. 7, No. 12, Dec. 2007, pp. 3603-3607.

Kuk-Hwan Kim et al. "Doping-free nanoscale complementary carbon-nanotube field effect transistors with DNA-templated molecular lithography." Small Wiley-Vch Verlag, Gmbh, Germany, vol. 4, No. 11, Nov. 2008, pp. 1959-1963.

Bachtold et al. "Logic Circuits with Carbon Nanotube Transistors." Science, American Association for the Advancement of Science, Washington, DC, USA, vol. 294, No. 5545, Nov. 9, 2001, pp. 1317-1320.

U.S. Office Action dated Oct. 5, 2009, for U.S. Appl. No. 12/232,956.

U.S. Office Action dated Mar. 31, 2010, for U.S. Appl. No. 12/232,956.

U.S. Office Action dated Jul. 2, 2010, for U.S. Appl. No. 12/232,956.

U.S. Office Action dated Dec. 21, 2010, for U.S. Appl. No. 12/232,956.

Notice of Allowance dated May 17, 2011, for U.S. Appl. No. 12/232,956.

Japanese Office Action dated Feb. 25, 2014 for corresponding Japanese Application No. 2010-033589.

* cited by examiner

STATIC RANDOM ACCESS MEMORIES HAVING CARBON NANOTUBE THIN FILMS

CROSS-REFERENCE TO RELATED APPLICATION(S)

This application claims priority under 35 U.S.C. §119 to Korean Patent Application No. 10-2009-0013504, filed on Feb. 18, 2009, in the Korean Intellectual Property Office. The entire contents of this application is incorporated by reference.

BACKGROUND

1. Field

One or more example embodiments relate to semiconductor memory devices, for example, static random access memories (SRAMs) including carbon nanotube (CNT) films.

2. Description of the Related Art

Related art silicon (Si)-based semiconductor devices are relatively highly integrated, have relatively high performance, and are relatively inexpensive. Based on these advantages, processes of miniaturizing Si-based semiconductor devices have been continuously developed. However, about 5 to 10 years from now, the development of such miniaturization processes will likely slow and/or stop due to property limitations of Si and process difficulties.

As an alternative, research into electronic devices using carbon nanotubes (CNTs) is being performed. A diameter of a CNT may be as small as several nanometers (nm=$10^{-9}$m). Thus, CNTs may be used to form micro channels that cannot be formed using Si-based miniaturization processes. Also, CNTs have excellent physical characteristics due to their structural characteristics such as charge mobility, current density, thermal conductivity, mechanical strength, etc. As a result, limitations in development of miniaturization processes of Si-based semiconductor devices may be overcome by using CNTs.

However, applying CNTs practically in electronic devices is somewhat difficult because CNTs have reliability problems. In addition, arranging CNTs in a given, desired or predetermined location is relatively difficult. To manufacture CNT electronic devices, a single-walled semiconducting CNT having a diameter of nanometers is needed to utilize the sufficient or excellent unique characteristics of CNTs. However, controlling changes in characteristics by changing a tube diameter is relatively difficult, and thus, CNTs are not suitable for practical use.

Recently, research into a CNT film used as an electronic device has been performed. For the CNT film, charge mobility is relatively low (e.g., about 10~200 cm$^2$/Vs, inclusive) compared to a single-walled CNT, but characteristic stability is relatively high and the manufacturing process is relatively simple.

SUMMARY

One or more example embodiments provide static random access memories (SRAMs) that are relatively easily manufactured and may be formed on a flexible or glass substrate.

One or more example embodiments provide SRAMs including an inverter having a carbon nanotube (CNT) film.

According to at least one example embodiment, a SRAM includes at least one CNT inverter. According to at least this example embodiment, the CNT inverter includes a plurality of (e.g., two) different CNT transistors or a plurality of (e.g., two) the same CNT transistors. The plurality of different CNT transistors may be ambipolar CNT transistors. The plurality of same CNT transistors may be n-type or p-type CNT transistors. If the CNT inverter includes two of the same CNT transistors, a gate and a source of a CNT transistor connected to a power source voltage of the CNT inverter may be connected to each other.

A CNT inverter including two different CNT transistors may be a complimentary metal oxide semiconductor (CMOS) type, whereas the CNT inverter including two of the same CNT transistors may be an enhancement type.

A logic threshold voltage Vm of the CNT inverter may be in the range of about 50%±about 5% of an input voltage.

According to at least some example embodiments, with respect to the CNT inverters, voltage corresponding to points of a curve showing voltage transfer characteristics where a tangential line to the curve has a slope of about −1 are between about 0.8 Vm and about 1.2 Vm, inclusive.

At least one other example embodiment provides a static random access memory (SRAM). According to at least this example embodiment, the SRAM includes at least two carbon nanotube (CNT) inverters connected to one another. Each CNT inverter has at least two CNT transistors connected in series between a supply voltage and ground.

At least one other example embodiment provides a static random access memory (SRAM). According to at least this example embodiment, the SRAM includes at least two carbon nanotube (CNT) inverters. Each CNT inverter has at least two CNT transistors connected in series between a supply voltage and ground. The at least two transistors are configured such that each CNT inverter is one of CMOS-type and enhancement-load type inverters.

According to at least some example embodiments, at least one of the first and second CNT transistors includes an insulating layer formed on a substrate, and source and drain electrodes formed on the insulating layer. The source and drain electrodes are spaced apart from one another by a CNT channel formed on the insulating layer between the source and drain electrode. The at least one of the first and second CNT transistors further includes a gate insulating layer and a gate electrode. The gate insulating layer is formed on the CNT channel and the source and drain electrodes such that the gate insulating layer partially overlaps the source and drain electrodes. The gate electrode is formed on the gate insulating layer.

A gate of the first switching transistor is connected to a wordline, an input terminal of the first switching transistor is connected to a first bit line, and an output terminal of the first switching device is connected to an input terminal of the second inverter. A gate of the second switching transistor is connected to a wordline, an input terminal of the second switching transistor is connected to a second bit line, and an output terminal of the second switching device is connected to an input terminal of the first inverter.

According to at least some example embodiments, a first switching transistor is connected to a first of the at least two CNT inverters, and a second switching transistor is connected to a second of the at least two CNT inverters. The at least two CNT transistors may be different or the same types of CNT transistors.

BRIEF DESCRIPTION OF THE DRAWINGS

Example embodiments will become more apparent and readily appreciated from the following description of the accompanying drawings in which.

DETAILED DESCRIPTION

Figure 1:
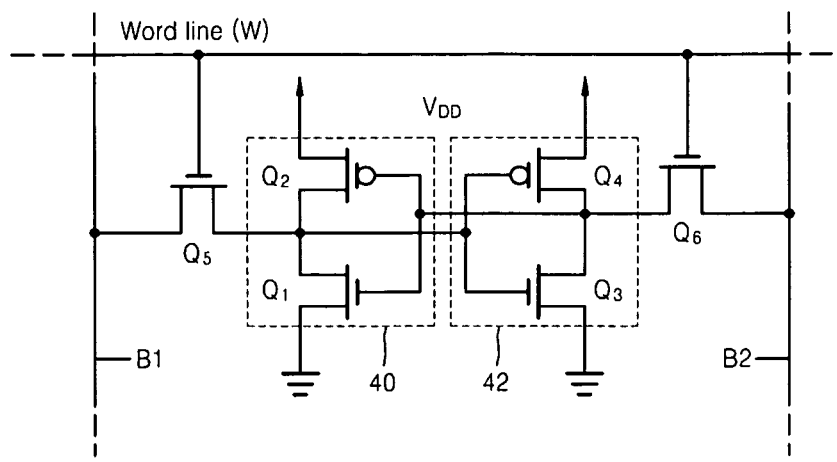
FIG. 1 is a circuit diagram of a static random memory (SRAM) including carbon nanotubes (CNTs) according to an example embodiment.

Reference will now be made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below by referring to the figures to explain aspects of the general inventive concept.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. Example embodiments may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, method steps or actions, these elements, steps or actions should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further still, it should also be noted that in some alternative implementations, the steps/functions/acts noted may occur out of the order noted in the figures. For example, two figures shown in succession may in fact be executed substantially concurrently or may sometimes be executed in the reverse order, depending upon the steps/functionality/acts involved. In addition, the order of the steps/actions/operations/interactions may be re-arranged.

Hereinafter, a static random access memory (SRAM) including carbon nanotubes (CNTs) according to example embodiments will be described in detail with reference to the attached drawings. In the drawings, the thicknesses of layers and regions are exaggerated for clarity.

FIG. 1 is a circuit diagram of a static random access memory (SRAM), hereinafter referred to as a first SRAM, including CNTs according to an example embodiment.

Referring to FIG. 1, the first SRAM includes a plurality of (e.g., first through sixth) transistors Q1 through Q6. The first transistor Q1 and the second transistor Q2 are configured to form a first inverter 40. As shown in FIG. 1, the first transistor Q1 and the second transistor Q2 are connected in series between a supply voltage $V_{DD}$ and ground. The third transistor Q3 and the fourth transistor Q4 are configured to form a second inverter 42. As shown in FIG. 1, the third transistor Q3 and the fourth transistor Q4 are connected in series between the supply voltage $V_{DD}$ and ground. The first inverter 40 and the second inverter 42 are configured to form a flip-flop circuit. In more detail with reference to the example embodiment shown in FIG. 1, an output of the first inverter 40 is connected to an input of the second inverter 42. And, an output of the second inverter 42 is connected to an input of the first inverter 40. As shown in FIG. 1, the first inverter 40 and the second inverter 42 are connected between the supply voltage $V_{DD}$ and ground.

The fifth and sixth transistors Q5 and Q6 serve as on/off switches for the first SRAM. A gate of the fifth transistor Q5 is connected to a word line W. In addition, an end or terminal of the fifth transistor Q5 is connected to a first bit line B1. Another end or terminal of the fifth transistor Q5 is connected to an output of the first inverter 40 and an input of the second inverter 42. An end or terminal of the sixth transistor Q6 is connected to a second bit line B2, whereas the other end or terminal of the sixth transistor Q6 is connected to an output of the second inverter 42 and an input of the first inverter 40. The gate of the sixth transistor Q6 is connected to the wordline W.

In example operation, when the first bit line B1 is high, the second bit line B2 is low. But, when the first bit line B1 is low, the second bit line B2 is high. For example, when the signal value of the first bit line B1 is 1, the signal value of the second bit line B2 is 0. But, when the signal value of the first bit line B1 is 0, the signal value of the second bit line B2 is 1.

The first and second transistor Q1 and Q2 included in the first inverter 40 may be an n-type transistor and a p-type transistor, respectively. Also, the third and fourth transistors Q3 and Q4 included in the second inverter 42 may be an n-type transistor and a p-type transistor, respectively. The first through fourth transistors Q1 through Q4 may be CNT transistors having a channel that includes a CNT film. Thus, the first and second inverters 40 and 42 may be CNT inverters.

According to at least one example embodiment, a CNT film may include at least two single-walled CNTs. When the first through fourth transistors Q1 through Q4 are CNT transistors as described above, types of the first through fourth transistors Q1 through Q4 may vary according to the supply voltage $V_{DD}$ (also referred to herein as a supply voltage $V_{DD}$). For example, when the supply voltage $V_{DD}$ is a positive voltage, as illustrated in FIG. 1, the first through fourth transistors Q1 through Q4 may be n-type, p-type, n-type and p-type transistors, respectively. On the other hand, when the supply voltage $V_{DD}$ is a negative voltage, the first through fourth transistors Q1 through Q4 may be p-type, n-type, p-type and n-type transistors, respectively. Accordingly, when the transistors of the first and second inverters 40 and 42 are CNT transistors as illustrated, for example, in FIG. 2, each of the transistors of the first and second inverters 40 and 42 may be a p-type or n-type transistor according to the supply voltage $V_{DD}$. That is, for example, each of the transistors of the first and second inverters 40 and 42 may be an ambipolar CNT transistor. Detailed descriptions about such transistors are included in Korean Patent Publication No. 2008-003889, the contents of which are incorporated herein by reference.

Figure 2:
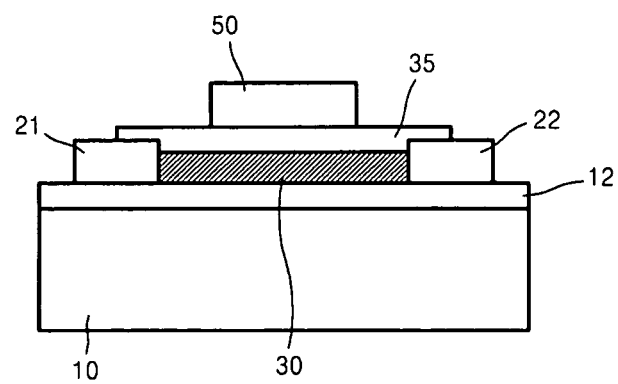
FIG. 2 is a cross-sectional view of a transistor included in CNT inverters illustrated in FIGS. 1 and 4.

FIG. 2 is a cross-sectional view of a CNT transistor according to an example embodiment. The CNT transistor shown in FIG. 2 may be used as the first through fourth transistors Q1 through Q4.

Referring to the example embodiment shown in FIG. 2, an insulating layer 12 is formed on a substrate 10. The substrate 10 may be, for example, a silicon or similar substrate. The insulating layer 12 may be, for example, a silicon oxide or similar layer. Source and drain electrodes 21 and 22 are formed on the insulating layer 12. The source and drain electrodes 21 and 22 may be separated from each other by a CNT channel 30 formed on a portion of the insulating layer 12 between the source and drain electrodes 21 and 22. The CNT channel 30 may include a plurality of single-walled CNTs. In this example, the plurality of single-walled CNTs may be formed in a film on the insulating layer 12. A gate insulating layer 35 may be formed on the CNT channel 30. The gate insulating layer 35 at least partially overlaps (vertically) each of the source and drain electrodes 21 and 22. As shown in FIG. 2, according to at least this example embodiment, the gate insulating layer 35 overlaps a portion of the upper surface of the source and drain electrodes 21 and 22. The gate insulating layer 35 may be, for example, an aluminum oxide or similar layer. A gate electrode 50 is formed on the gate insulating layer 35.

Because the first SRAM shown in FIG. 1 uses a transistor including a CNT film as a channel, the manufacturing temperature of the first SRAM may be lower than that of a Si-based SRAM. Accordingly, the first SRAM may be used in a wider range of applications. For example, the first SRAM may be formed on a hard substrate as well as a flexible substrate, a glass substrate, etc.

Figure 3:
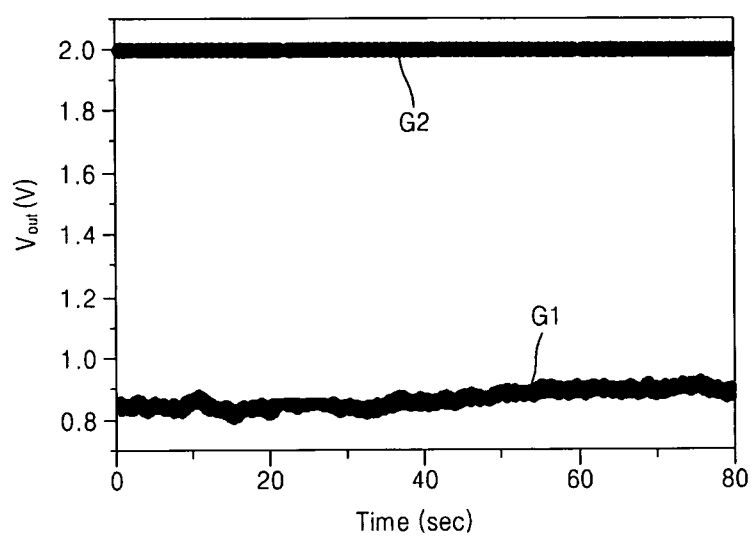
FIG. 3 is a graph illustrating example driving characteristics of the SRAM illustrated in FIG. 1.

FIG. 3 is a graph illustrating example driving characteristics of the first SRAM illustrated in FIG. 1. The driving characteristics are represented as characteristics of an output voltage of the first SRAM electrically isolated from the outside after a signal for recording data is applied to the first SRAM.

In FIG. 3, a first plot G1 shows the output voltage of any one of the first and second inverters 40 and 42 of the electrically isolated first SRAM. A second plot G2 shows the output voltage of the other of the first and second inverters 40 and 42.

Referring to FIG. 3, the output voltage of the first SRAM with respect to time is maintained in a high state (the second plot G2) or a low state (the first plot G1). The high and low states of the first SRAM represent data recorded in the first SRAM. Accordingly, the results shown in FIG. 3 indicate that the data recorded in the first SRAM is maintained constant or substantially constant with respect to time.

Figure 4:
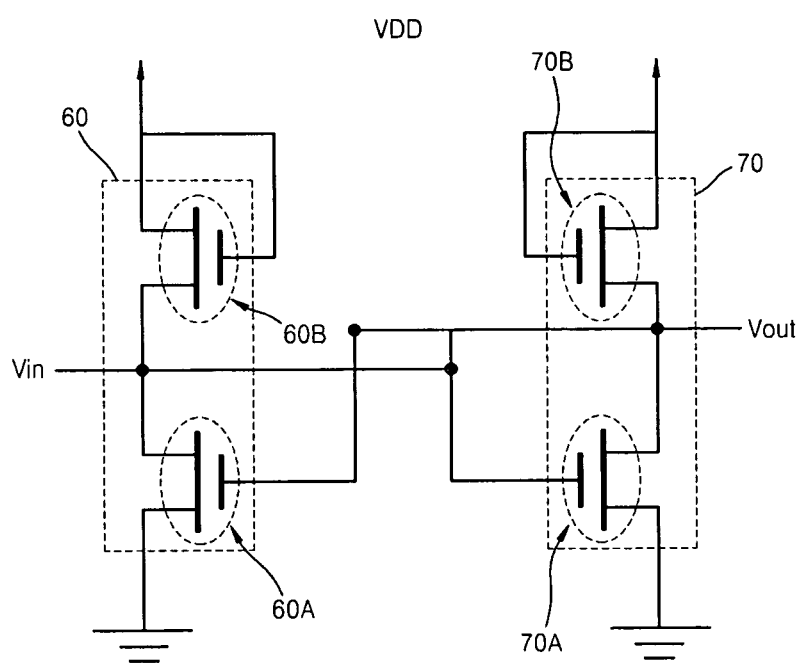
FIG. 4 is a circuit diagram of a SRAM including CNTs according to another example embodiment.

FIG. 4 is a circuit diagram of a SRAM (hereinafter, referred to as a second SRAM) according to another example embodiment. FIG. 4 does not illustrate the fifth and sixth transistors Q5 and Q6 illustrated in FIG. 1 such that the example embodiment may be more easily described. However, the example embodiment shown in FIG. 4 may further include these transistors configured in the same manner as shown in FIG. 1 as discussed in more detail below.

Referring to FIG. 4, the second SRAM includes a first inverter 60 and a second inverter 70. An input signal Vin may be applied to the input of the first inverter 60. In one example, the input terminal of the first inverter 60 is connected to a first on/off switching transistor (not shown) configured to generate the input signal Vin. The first on/off switching transistor may correspond to the fifth transistor Q5 illustrated in FIG. 1. An output terminal of the second inverter 70 may output an output signal Vout. In one example, the output terminal of the second inverter 70 is connected to a second on/off switching transistor (not shown). The second on/off switching transistor may correspond to the sixth transistor Q6 shown in FIG. 1.

Still referring to the example embodiment shown in FIG. 4, the first inverter 60 includes a first transistor 60A and a second transistor 60B. Each of the first transistor 60A and the second transistor 60B may be a CNT transistor, for example, the CNT transistor illustrated in FIG. 2. In this regard, the first and second transistors 60A and 60B may be n-type CNT transistors.

The second inverter 70 includes a third transistor 70A and a fourth transistor 70B. Each of the third transistor 70A and the fourth transistor 70B may also be a CNT transistor, for example, the CNT transistor illustrated in FIG. 2. In this regard, the third and fourth transistors 70A and 70B may also be n-type CNT transistors.

As shown in FIG. 4, a gate of the second transistor 60B is connected to a terminal (e.g., source) of the second transistor 60B, which is further connected to supply voltage VDD. Also, a gate of the fourth transistor 70B is connected to a terminal (e.g., source) of the fourth transistor 70B, which is also connected to supply voltage VDD. Thus, the first and second inverters 60 and 70 are enhancement load-type inverters. Because each of the first through fourth transistors 60A, 60B, 70A, and 70B include a CNT channel, the second SRAM may have higher mobility and/or lower power consumption than related art SRAMs including register load-type inverters having one electric field effect transistor including one resistor.

Figure 5:
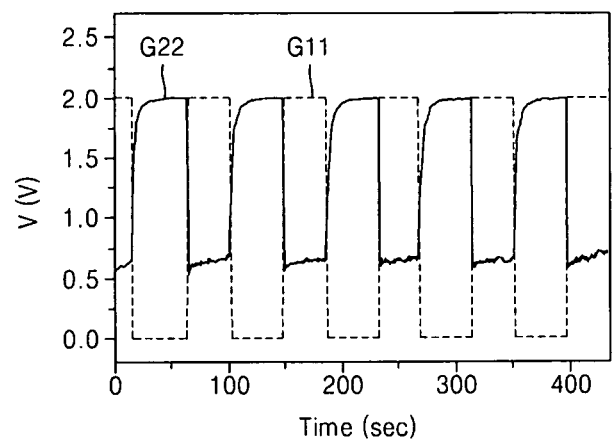
FIG. 5 is a graph illustrating example driving characteristics of the SRAM illustrated in FIG. 4.

FIG. 5 is a graph illustrating example driving characteristics of the second SRAM illustrated in FIG. 4, and shows a change in the output signal Vout according to whether the input signal Vin is high or low.

In FIG. 5, a first plot G11 illustrates a change in the input signal Vin, and a second plot G22 illustrates a change in the output signal Vout with respect to the input signal Vin.

Referring to the first and second plots G11 and G22, when the input signal Vin is high, the output signal Vout is low. But, when the input signal Vin is low, the output signal Vout is high. This relationship between the input signal Vin and the output signal Vout is regularly repeated over time and is maintained. The results shown in FIG. 5 are not related to (are independent of) where the input signal Vin is input. Based on the results shown in FIG. 5, for the second SRAM, switching characteristics of the output signal Vout with respect to the input signal Vin are maintained over time regardless of (or independent of) where the input signal Vin is input.

Figure 6:
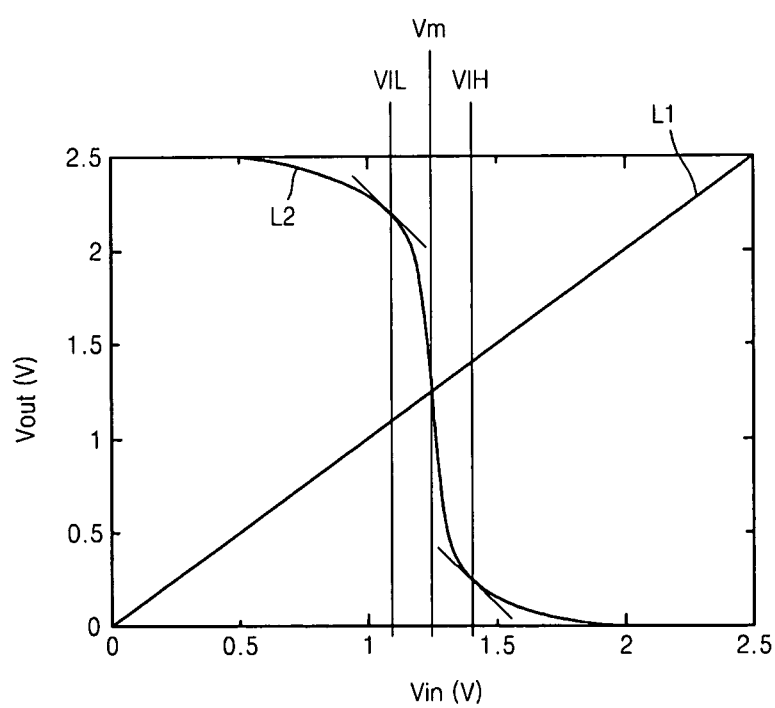
FIG. 6 is a graph illustrating example voltage transfer characteristics of CNT inverters included in the SRAMs illustrated in FIGS. 1 and 4.

FIG. 6 is a graph illustrating example voltage transfer characteristics of CNT inverters included in the first and second SRAMs illustrated in FIGS. 1 and 4.

Referring to FIG. 6, a reference numeral L1 denotes a straight line having a slope of about +1, and a reference numeral Vm denotes a logic threshold voltage. A logic threshold voltage Vm is a threshold voltage used to determine whether the input voltage Vin is high or low. In this example, the logic threshold voltage Vm is a voltage corresponding to a junction where a curve L2 showing voltage transfer characteristics meet the straight line L1 having a slope of about +1. To obtain a stable switching operation in the vicinity of the logic threshold voltage Vm or a reliable switching operation, the logic threshold voltage Vm may be set within a given, desired or predetermined range, rather than a specific voltage (e.g., a single value). For example, the logic threshold voltage Vm may be set to be in the range of about 50%±about 5% of the input voltage Vin or output voltage Vout. If the input voltage Vin is in the range of about 0 to about 2.5 V, inclusive, as illustrated in FIG. 6, the logic threshold voltage Vm may be about 45% to about 55%, inclusive, of the input voltage Vin range. In this case, the logic threshold voltage Vm may be higher than about 1 V, but lower than about 1.5V.

In FIG. 6, first and second input voltages VIL and VIH are input voltages corresponding to a unity gain point. In other words, the first and second input voltages VIL and VIH are input voltages corresponding to points of the curve L2 at which a tangential line thereto has a slope of −1. In curve L2, when the input voltage Vin is greater than the first input voltage VIL, the output voltage Vout rapidly decreases. When the input voltage Vin becomes the first input voltage VIL, the input voltage Vin begins to change from low to high and the output voltage Vout begins to change from high to low. Until the input voltage Vin becomes the second input voltage VIH, the output voltage Vout rapidly decreases.

When the input voltage Vin is greater than or equal to the second input voltage VIH, a decrease rate of the output voltage Vout is reduced, and ultimately, the output voltage Vout becomes 0. Accordingly, when the input voltage Vin is greater than or equal to the second input voltage VIH, the input voltage Vin is high (e.g., completely high), and the output voltage Vout is low (e.g., completely low).

Although the output voltage Vout rapidly decreases when the input voltage Vin is higher than the first input voltage VIL, the output voltage Vout becomes completely low when the input voltage Vin is greater than or equal to the second input voltage VIH. On the other hand, when the input voltage Vin is initially high, and thus, the output voltage Vout is low, the output voltage Vout becomes high when the input voltage Vin is less than or equal to the first input voltage VIL. Accordingly, when the input voltage Vin is between the first and second input voltages VIL and VIH, the high or low state of the output voltage Vout remains in the same state as before.

The first input voltage VIL is lower than the logic threshold voltage Vm, and the second input voltage VIH is higher than the logic threshold voltage Vm. The first input voltage VIL may be, for example, about 80% of the logic threshold voltage Vm, for example, about 0.8 Vm. And, the second input voltage VIH may be, for example, about 120% of the logic threshold voltage, for example, about 1.2 Vm.

SRAMs according to at least some example embodiments include transistors having a CNT film as a channel. Accordingly, the manufacturing process may be relatively simple as compared to when a strand type single-wall CNT is used. In addition, more uniform characteristics may be obtained. For example, variation in characteristics of SRAMs manufactured in the same or substantially the same manufacturing process may be suppressed and/or minimized.

Also, a CNT film according to at least some example embodiments may have an ambipolar characteristic (e.g., n-type and p-type characteristics). And, SRAMs according to at least some example embodiments include a CMOS inverter formed using the CNT film, and thus, have improved (e.g., excellent) operating characteristics.

Also, SRAMs including CNT films may be manufactured at lower temperatures than when a Si-based SRAM is manufactured. Thus, SRAMs according to at least some example embodiments may be used in a wider range of applications. For example, the SRAMs may be formed on, in addition to a hard substrate, a flexible substrate or a glass substrate.

It should be understood that the example embodiments described herein should be considered in a descriptive sense only and not for purposes of limitation. Descriptions of features or aspects within each example embodiment should typically be considered as available for other similar features or aspects in other embodiments.

What is claimed is:

1. A static random access memory (SRAM) comprising:
   a first carbon nanotube (CNT) inverter including at least a first CNT transistor;
   a second CNT inverter connected to the first CNT inverter, the second CNT inverter including at least a second CNT transistor;
   a first switching transistor connected to at least the first CNT inverter; and
   a second switching transistor connected to at least the second CNT inverter;
   wherein at least one of the first and second CNT transistors comprises
      an insulating layer directly formed on a substrate;
      source and drain electrodes directly formed on the insulating layer, the source and drain electrodes being spaced apart from one another;
      a CNT channel directly formed on the insulating layer between the source and drain electrode;
      a gate insulating layer formed on the CNT channel and the source and drain electrodes such that the gate insulating layer partially overlaps the source and drain electrodes; and
      a gate electrode formed on the gate insulating layer, wherein the source and drain electrodes and the CNT channel directly contact the insulation layer.

2. The SRAM of claim 1, wherein each of the first and second CNT inverters include two different CNT transistors or two of the same CNT transistors.

3. The SRAM of claim 2, wherein the two different CNT transistors are ambipolar CNT transistors.

4. The SRAM of claim 2, wherein the two of the same CNT transistors are n-type or p-type CNT transistors.

5. The SRAM of claim 1, wherein at least one of the first and second CNT inverters includes two of the same CNT transistors, a first of the two of the same CNT transistors having a source connected to a source voltage and a gate connected to the source.

6. The SRAM of claim 1, wherein a logic threshold voltage of the first and second CNT inverters is in the range of about 50% ±about 5% of an input voltage.

7. The SRAM of claim 6, wherein, with respect to each of the first and second CNT inverters, voltages corresponding to points of a curve showing voltage transfer characteristics where a tangential line to the curve has a slope of about −1 are about 0.8 Vm and about 1.2 Vm.

8. The SRAM of claim 1, wherein, with respect to each of the first and second CNT inverters, voltages corresponding to points of a curve showing voltage transfer characteristics where a tangential line to the curve has a slope of about −1 are about 0.8 Vm and about 1.2 Vm.

9. The SRAM of claim 1, wherein a gate of the first switching transistor is connected to a wordline, an input terminal of the first switching transistor is connected to a first bit line, and an output terminal of the first switching device is connected to an input terminal of the second inverter.

10. The SRAM of claim 9, wherein a gate of the second switching transistor is connected to a wordline, an input terminal of the second switching transistor is connected to a second bit line, and an output terminal of the second switching device is connected to an input terminal of the first inverter.

11. A static random access memory (SRAM) comprising:
at least two carbon nanotube (CNT) inverters connected to one another, each CNT inverter having at least two CNT transistors connected in series between a supply voltage and ground;
wherein at least one of the at least two CNT transistors comprises
an insulating layer directly formed on a substrate;
source and drain electrodes directly formed on the insulating layer, the source and drain electrodes being spaced apart from one another;
a CNT channel directly formed on the insulating layer between the source and drain electrode;
a gate insulating layer formed on the CNT channel and the source and drain electrodes such that the gate insulating layer partially overlaps the source and drain electrodes; and
a gate electrode formed on the gate insulating layer, wherein the source and drain electrodes and the CNT channel directly contact the insulation layer.

12. The SRAM of claim 11, wherein the at least two CNT transistors are different types of CNT transistors.

13. The SRAM of claim 11, wherein the at least two CNT transistors are the same type of CNT transistors.

14. The SRAM of claim 11, wherein at least a first of the at least two CNT transistors comprises:
an insulating layer formed on a substrate;
source and drain electrodes formed on the insulating layer, the source and drain electrodes being spaced apart from one another;
a CNT channel formed between the source and drain electrode;
a gate insulating layer formed on the CNT channel and the source and drain electrodes such that the gate insulating layer partially overlaps the source and drain electrodes; and
a gate electrode formed on the gate insulating layer.

15. The SRAM of claim 11, further comprising:
a first switching transistor connected to a first of the at least two CNT inverters; and
a second switching transistor connected to a second of the at least two CNT inverters.

16. A static random access memory (SRAM) comprising:
at least two carbon nanotube (CNT) inverters, each CNT inverter having at least two CNT transistors connected between a supply voltage and ground, the at least two transistors being configured such that each CNT inverter is one of a CMOS-type and enhancement-load type inverter;
wherein at least one of the at least two CNT transistors comprises
an insulating layer directly formed on a substrate;
source and drain electrodes directly formed on the insulating layer, the source and drain electrodes being spaced apart from one another;
a CNT channel directly formed on the insulating layer between the source and drain electrode;
a gate insulating layer formed on the CNT channel and the source and drain electrodes such that the gate insulating layer partially overlaps the source and drain electrodes; and
a gate electrode formed on the gate insulating layer, wherein the source and drain electrodes and the CNT channel directly contact the insulation layer.

17. The SRAM of claim 16, further comprising:
a first switching transistor connected to a first of the at least two CNT inverters; and
a second switching transistor connected to a second of the at least two CNT inverters.

* * * * *